United States Patent
Park et al.

(10) Patent No.: US 8,105,551 B2
(45) Date of Patent: Jan. 31, 2012

(54) MICROFLUIDIC DEVICE AND METHOD OF FABRICATING THE SAME

(75) Inventors: Jongmyeon Park, Seoul (KR); Jeonggun Lee, Seoul (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 320 days.

(21) Appl. No.: 12/417,716

(22) Filed: Apr. 3, 2009

(65) Prior Publication Data

US 2009/0252651 A1 Oct. 8, 2009

(30) Foreign Application Priority Data

Apr. 7, 2008 (KR) .................. 10-2008-0032178

(51) Int. Cl.
- *B01L 3/00* (2006.01)
- *B04B 5/02* (2006.01)
- *F16K 3/00* (2006.01)
- *B04B 7/00* (2006.01)
- *F04B 19/00* (2006.01)
- *G01N 9/30* (2006.01)

(52) U.S. Cl. ........ 422/502; 422/504; 422/506; 422/537; 422/72; 494/16; 494/17; 494/23; 494/43; 137/803; 137/822; 137/823

(58) Field of Classification Search .................. None
See application file for complete search history.

(56) References Cited

U.S. PATENT DOCUMENTS

| | | | | |
|---|---|---|---|---|
| 6,548,788 | B2* | 4/2003 | Kellogg et al. | 219/543 |
| 2003/0156991 | A1* | 8/2003 | Halas et al. | 422/100 |
| 2005/0084422 | A1* | 4/2005 | Kido et al. | 422/100 |
| 2006/0210449 | A1* | 9/2006 | Zoval et al. | 422/102 |
| 2009/0281250 | A1* | 11/2009 | DeSimone et al. | 525/418 |

* cited by examiner

*Primary Examiner* — Brian J Sines
*Assistant Examiner* — Jennifer Wecker
(74) *Attorney, Agent, or Firm* — Sughrue Mion, PLLC

(57) ABSTRACT

A microfluidic device and a method of fabricating the microfluidic device are provided. The microfluidic device includes: a platform including an upper substrate and a lower substrate that are bonded to face each other; a microfluidic structure obtained by forming grooves in the lower substrate; a lower substrate protrusion pattern including an outline protrusion that protrudes from the lower substrate toward the upper substrate along an outline of the microfluidic structure; and an adhesive layer disposed between the lower substrate protrusion pattern and the upper substrate in order to bond the upper substrate and the lower substrate to each other. The lower substrate protrusion pattern only supports the upper substrate, and remaining portions of the lower substrate except for the lower substrate protrusion pattern do not have structures for supporting the upper substrate.

11 Claims, 7 Drawing Sheets

MICROFLUIDIC DEVICE AND METHOD OF FABRICATING THE SAME

CROSS-REFERENCE TO RELATED PATENT APPLICATIONS

This application claims priority from Korean Patent Application No. 10-2008-0032178, filed on Apr. 7, 2008, in the Korean Intellectual Property Office, the disclosure of which is incorporated herein in its entirety by reference.

BACKGROUND OF THE INVENTION

1. Field of the Invention

Apparatuses and methods consistent with the present invention relate to a microfluidic device, and more particularly, to a microfluidic device including two bonded sheets and a method of fabricating the microfluidic device.

2. Description of the Related Art

Microfluidic devices are used to perform biological or chemical reactions by operating a small amount of fluid. A related art microfluidic device includes a microfluidic structure formed in a platform, for example, a chip or a disk. The microfluidic structure includes a chamber that can store a fluid, a channel, through which the fluid can flow, or a valve that may adjust the flow of the fluid. The chamber, the channel, or the valve may be formed in the platform in various combinations.

A bio chip is formed by disposing a microfluidic structure on a chip so that tests including biochemical reactions can be performed on a small size of the chip. In particular, a device for performing a plurality of processes and operations on one chip is referred to as a lab-on-a-chip.

In order to transport the fluid in the microfluidic structure, a driving pressure is required. A capillary pressure or a pressure generated by an additional pump may be used as the driving pressure. Recently, centrifugal force-based microfluidic devices, wherein a microfluidic structure is placed on a rotating platform formed as a compact disk, have been suggested. The above centrifugal force-based microfluidic device is referred to as a Lab CD or a Lab-on-a-CD.

A related art method of fabricating a microfluidic device includes a process of engraving a surface of at least one of two substrates to form a microfluidic structure, and a process of bonding the two substrates to each other so as to enclose the microfluidic structure. The two substrates can be bonded to each other using a thermal bonding method, a solvent bonding method, an ultrasonic welding method, a laser welding method, or an adhesive bonding method.

U.S. Pat. No. 5,599,411 discloses a method of fabricating a microfluidic device using ultrasonic welding. However, in the ultrasonic welding method, a reagent in a liquid state may vaporize or degenerate since a strong energy of the ultrasonic waves is transferred to the entire platform, and thus, this method cannot be used to fabricate a microfluidic device by bonding two substrates after distributing a liquid reagent into a chamber. The thermal bonding method or the laser welding method require a high temperature or a high energy condition, and thus, it is difficult to use them to manufacture a microfluidic device including two substrates.

On the other hand, US patent application No. 2004/0241381 discloses a method of forming grooves for receiving an adhesive around a chamber or a channel of a lower substrate, and injecting a liquid adhesive into the grooves to bond an upper substrate and the lower substrate 12 to each other. However, according to this method, since the liquid adhesive should fully fill the grooves, a large amount of liquid adhesive is required. In addition, the liquid adhesive may overflow in the chamber or the channel from the grooves, thereby closing fine channels. Also, bonding reliability is degraded due to air bubbles formed on bonding surfaces of the two substrates, and accordingly, the fluid received in the chamber or the channel may leak.

SUMMARY

The present invention provides a microfluidic device including two substrates bonded to each other by an adhesive, and a method of fabricating the microfluidic device.

The present invention also provides a microfluidic device having improved bonding reliability by restraining generation of air bubbles when two substrates are bonded to each other using an adhesive, and a method of fabricating the microfluidic device.

According to an aspect of the present invention, there is provided a microfluidic device including: a platform including an upper substrate and a lower substrate that are bonded to face each other; a microfluidic structure obtained by forming grooves in the lower substrate; a lower substrate protrusion pattern including an outline protrusion that protrudes from the lower substrate toward the upper substrate along an outline of the microfluidic structure; and an adhesive layer disposed between the lower substrate protrusion pattern and the upper substrate in order to bond the upper substrate and the lower substrate to each other, wherein the lower substrate protrusion pattern only supports the upper substrate, and remaining portions of the lower substrate except for the lower substrate protrusion pattern do not have structures for supporting the upper substrate.

The lower substrate protrusion pattern may further include a boundary protrusion protruding from the lower substrate toward the upper substrate along a boundary of the platform.

The microfluidic device may further include: an upper substrate protrusion pattern that protrudes from the upper substrate toward the lower substrate so as to correspond to the lower substrate protrusion pattern, wherein the adhesive layer is disposed between the lower substrate protrusion pattern and the upper substrate protrusion pattern.

The platform may have a disk shape and is configured to rotate at a high speed around the center thereof.

The microfluidic structure may include one or more chambers that receive a fluid, and one or more channels connecting the chambers.

The microfluidic device may further include: at least one kind of liquid reagent that is received in some of the one or more chambers.

The adhesive may be an ultraviolet (UV) adhesive that is cured by UV rays.

The microfluidic device may further include: one or more valves for controlling flow of the fluid through the channels.

The valve may include a valve material that is in a solid state at a room temperature and melts when heated by electromagnetic waves, and the valve material may include a phase transition material that is in a solid state at the room temperature and a plurality of heat generating particles that generate heat to melt the phase transition material when heated by the electromagnetic waves, wherein the heat generated particles are dispersed in the phase transition material.

The valve may be a normally closed valve for opening the channels, or a normally open valve for closing the channels.

According to another aspect of the present invention, there is provided a method of fabricating a microfluidic device, the method including: preparing a lower substrate including a microfluidic structure obtained by forming grooves in the lower substrate, and a lower substrate protrusion pattern having an outline protrusion that protrudes along an outline of the microfluidic structure; preparing an upper substrate; applying an adhesive on the lower substrate protrusion pattern or on a surface of the upper substrate, which faces the lower substrate; attaching the upper substrate and the lower substrate to each other so that the adhesive may be disposed between the lower substrate protrusion pattern and the upper substrate; and bonding the upper substrate and the lower substrate to each other by curing the adhesive, wherein remaining portions of the lower substrate except for the lower substrate protrusion pattern are not bonded to the upper substrate.

The applying of the adhesive may include: applying the adhesive on an upper surface of the lower substrate protrusion pattern.

The applying of the adhesive may include: applying the adhesive onto the surface of the upper substrate, which faces the lower substrate, so as to correspond to the shape of the lower substrate protrusion pattern.

The preparing of the upper substrate may include: preparing the upper substrate having an upper substrate protrusion pattern protruding toward the lower substrate to correspond to the lower substrate protrusion pattern, and the applying of the adhesive may include: applying the adhesive onto a lower surface of the upper substrate protrusion pattern.

The applying of the adhesive may include: ejecting the adhesive on the lower substrate or the upper substrate using an inkjet printer having at least a nozzle for ejecting the adhesive.

An amount of the adhesive ejected from the nozzle of the inkjet printer at once may be between 1 picoliter (pl) and 100 microliter (μl).

The microfludic structure may include one or more chambers that is configured to receive a fluid, and one or more channels connected to the chambers.

The method may further include: injecting at least a kind of liquid reagent into at least some of the one or more chambers, before attaching the upper substrate and the lower substrate to each other.

The method may further include: forming one or more valves for controlling a flow of the fluid through the channels.

The applying of the adhesive may include: applying a UV adhesive that is cured by UV rays, and the bonding of the upper and lower substrates may include: irradiating UV rays on the upper substrate and the lower substrate.

The bonding of the upper substrate and the lower substrate may include: applying at least one of heat, pressure, and electromagnetic waves onto the upper substrate and the lower substrate.

BRIEF DESCRIPTION OF THE DRAWINGS

The above and other aspects of the present invention will become more apparent by describing in detail exemplary embodiments thereof with reference to the attached drawings, in which.

DETAILED DESCRIPTION

Figure 1:
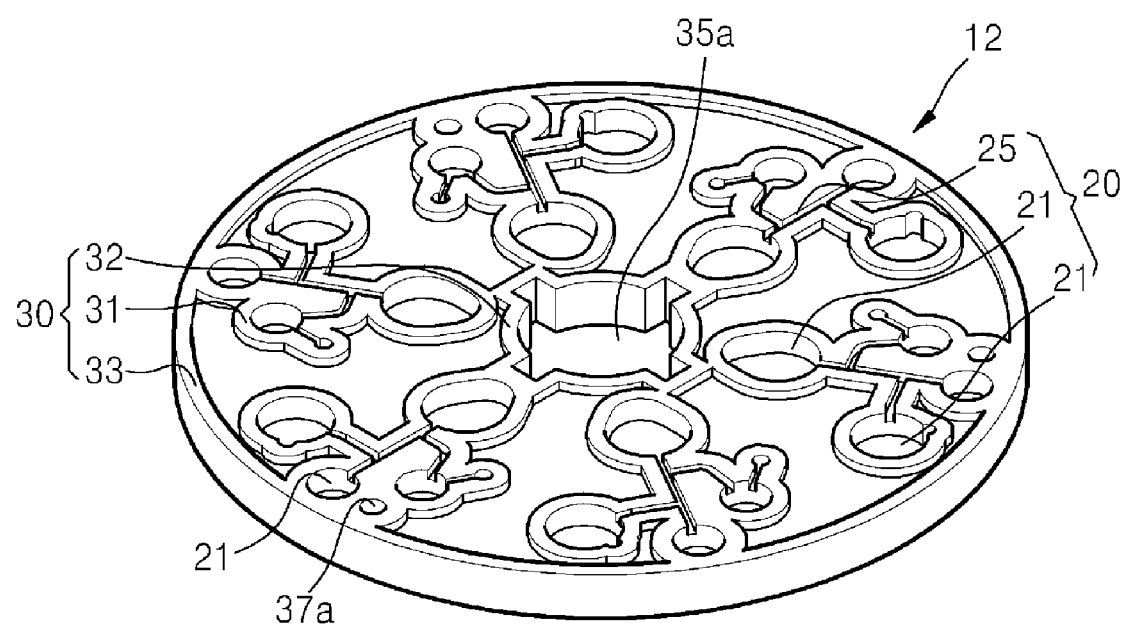
FIGS. 1 through 4 are perspective views illustrating a method of fabricating a microfluidic device according to an exemplary embodiment of the present invention.

The present invention will now be described more fully with reference to the accompanying drawings, in which exemplary embodiments of the invention are shown. In the drawings, the thicknesses of layers and regions are exaggerated for clarity.

Figure 7:
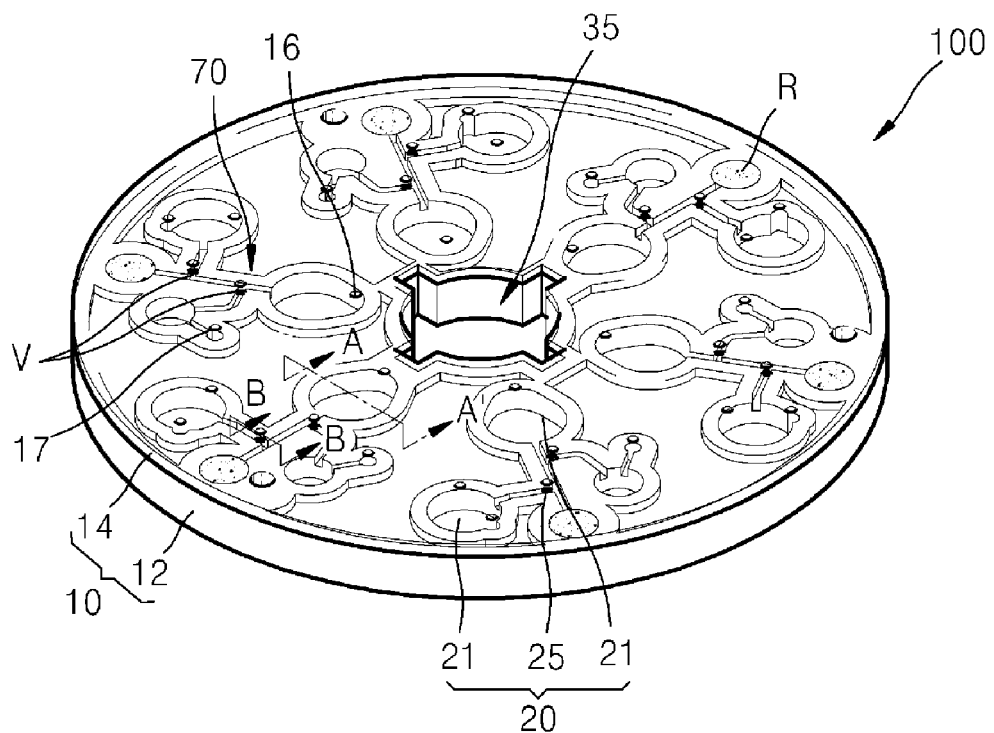
FIG. 7 is a perspective view of a microfluidic device according to an exemplary embodiment of the present invention.
Figure 8A:
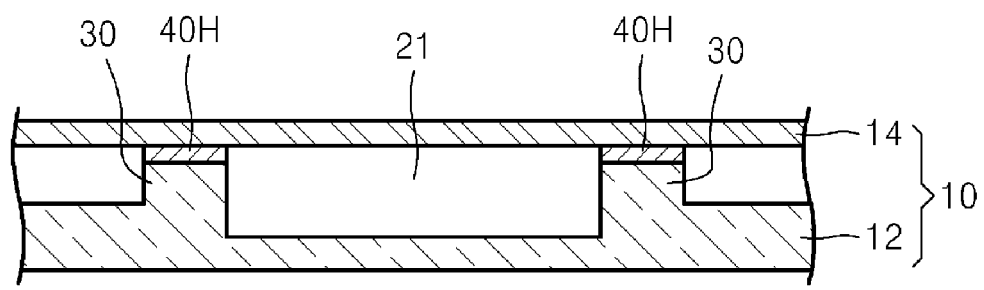
FIGS. 8A and 8B are cross-sectional views of the microfluidic device taken along line A-A' of FIG. 7, according to an exemplary embodiment of the present invention.
Figure 8B:
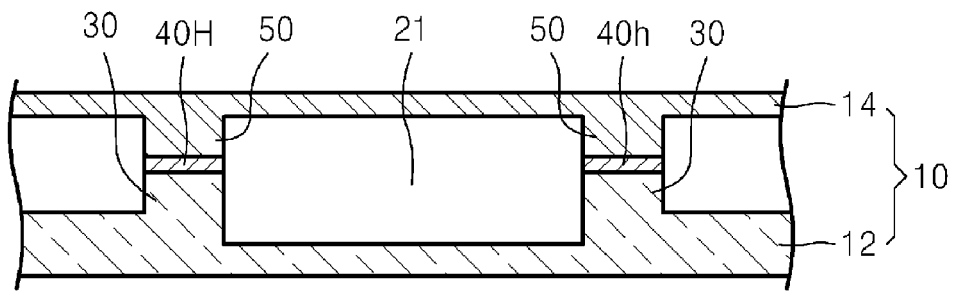

FIG. 7 is a perspective view of a microfluidic device according to an exemplary embodiment of the present invention, and FIGS. 8A and 8B are cross-sectional views of the microfluidic device taken along line A-A' of FIG. 7.

Referring to FIG. 7, a microfluidic device 100 according to an exemplary embodiment of the present invention includes a platform 10 having a disk shape, and a microfluidic structure 20 including at least one chamber 21 and at least one channel 25 formed in the platform 10. The chamber 21 receives a fluid, and the channel 25 is connected to the chamber 21. A motor mounting hole 35, in which a motor (not shown) for rotating the platform 10 is mounted, is formed in a center portion of the platform 10. The platform 10 loaded on the motor may rotate at a high speed, and the fluid may be conveyed in the microfluidic structure 20 by the generated centrifugal force. The platform 10 also includes a lower substrate 12 and an upper substrate 14.

Figure 5:
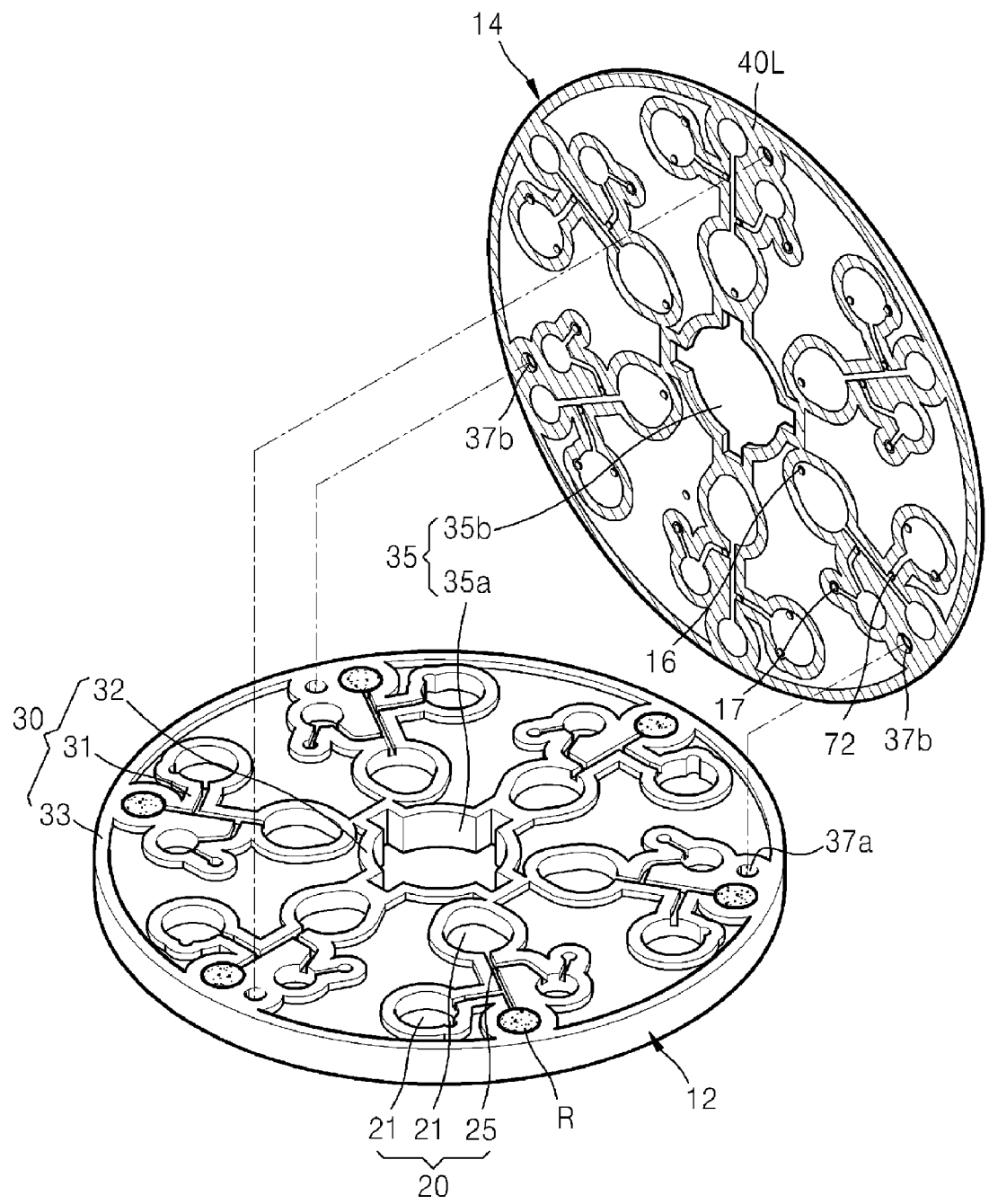
FIG. 5 is an exploded perspective view illustrating a method of fabricating a microfluidic device according to another exemplary embodiment of the present invention.
Figure 6:
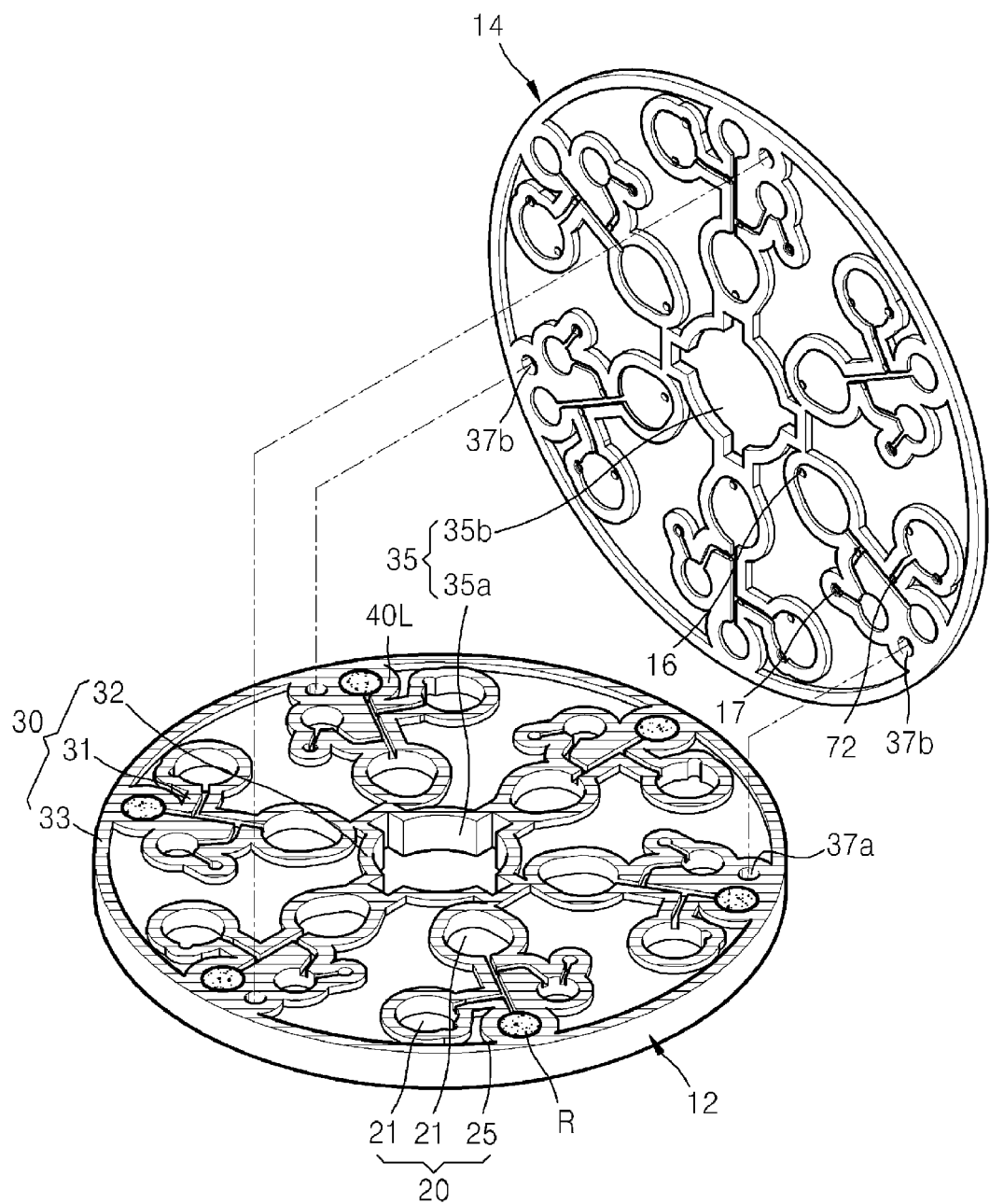
FIG. 6 is an exploded perspective view illustrating a method of fabricating a microfluidic device according to still another exemplary embodiment of the present invention.

FIGS. 1 through 4 are perspective views illustrating a method of fabricating the microfluidic device according to an exemplary embodiment of the present invention, FIG. 5 is an exploded perspective view illustrating a method of fabricating a microfluidic device according to another exemplary embodiment of the present invention, and FIG. 6 is an exploded perspective view illustrating a method of fabricating a microfluidic device according to still another exemplary embodiment of the present invention. Hereinafter, the method of fabricating the microfluidic device 100 shown in FIG. 7 and a detailed structural feature of the microfluidic device 100 will be described with reference to FIGS. 1 through 6.

Referring to FIG. 1, the lower substrate 12 is prepared. The lower substrate 12 includes the microfluidic structure 20, obtained by forming grooves in the substrate 12, and a protrusion pattern 30 that protrudes upward and corresponds to the microfluidic structure 20. The microfluidic structure 20 includes a plurality of chambers 21, and a channel 25 connecting to the chambers 21. The lower substrate protrusion pattern 30 includes an outline protrusion 31 upwardly protruding along the outline of the microfluidic structure 20, an inner boundary protrusion 32 upwardly protruding along an inner boundary of the platform 10 (refer to FIG. 6), that is, along a motor mounting hole 35a, and a boundary protrusion 33 upwardly protruding along an outer boundary of the platform 10, that is, an outer circumference of the platform 10. The lower substrate protrusion pattern 30 has a width of 1 to 2 mm. In addition, the lower substrate 12 includes aligning via holes 37a for aligning the lower substrate with respect to the upper substrate 14 (refer to FIG. 2).

The lower substrate 12 may be formed by injection molding of a plastic material such as an acryl or a polydimethylsiloxane (PDMS), that may be easily plasticized and have a surface that is biologically inert. The material for forming the lower substrate 12 is not limited to the above example, and any material that is chemically and biologically stable, transparent, and may be easily fabricated can be used.

Figure 2:
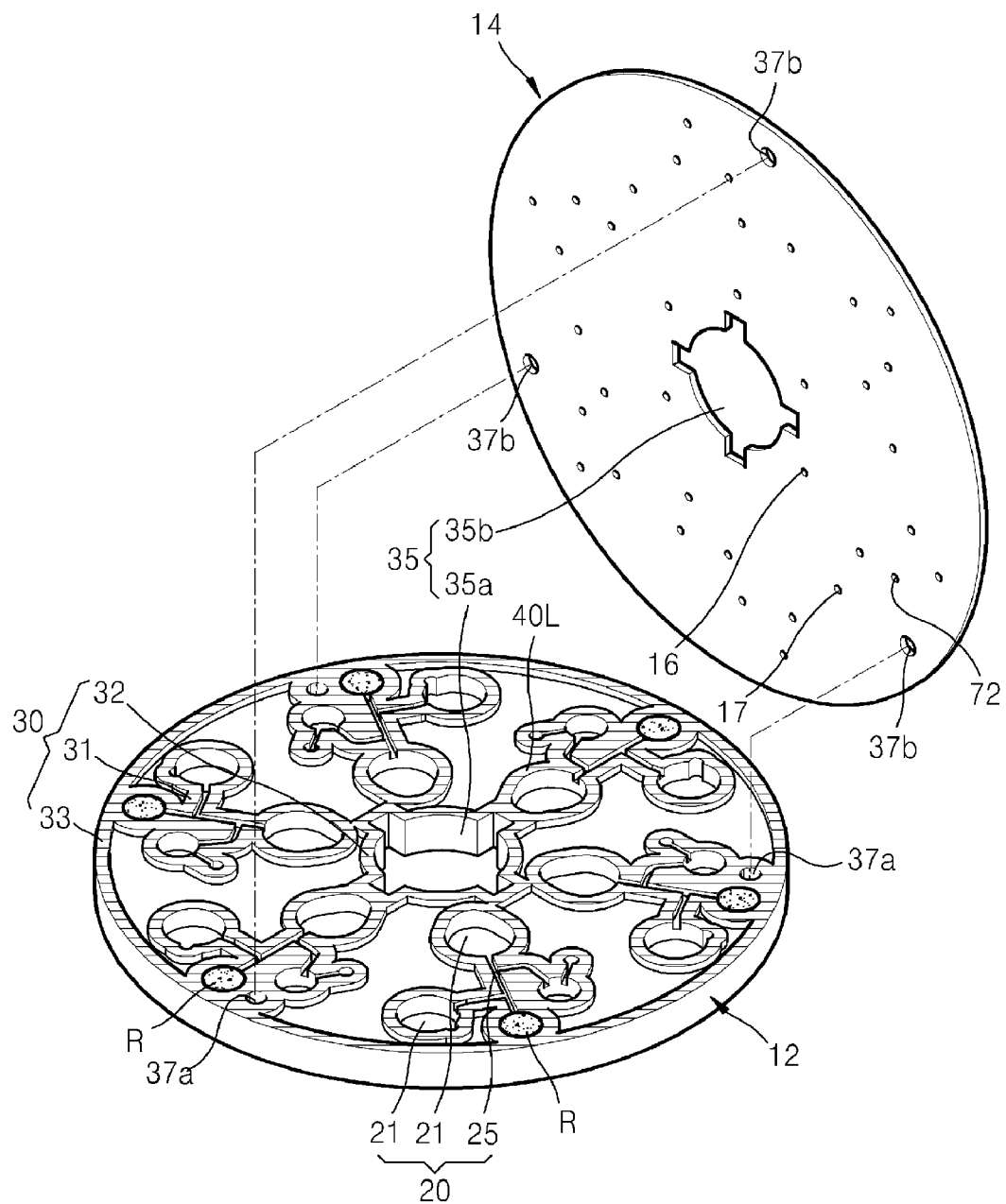

Next, the upper substrate 14 is prepared. Referring to FIG. 2, the upper substrate 14 is formed as a flat disk, and may be formed by injection molding of a plastic material such as acryl or polydimethylsiloxane (PDMS) like the lower substrate 12. A motor mounting hole 35b corresponding to the motor mounting hole 35a of the lower substrate 12 is formed in a center portion of the upper substrate 14, and an alignment through hole 37b corresponding to the alignment through hole 37a of the lower substrate 12 is formed. In addition, vent holes 17 for maintaining the pressure in the microfluidic structure 20 to be equal to the atmospheric pressure, fluid injection holes 16 for injecting the fluid into the chamber 21, and a valve material injection hole 72 for injecting a valve material (V) in order to form a valve 70 (refer to FIG. 7) are also formed in the upper substrate 14.

Alternatively, instead of preparing the flat upper substrate 14, an upper substrate 14 having an upper substrate protrusion patterns 50 that protrudes toward the lower substrate 12 so as to correspond to the lower substrate protrusion pattern 30 may be prepared (refer to FIG. 6).

Next, an adhesive 40L is applied on an upper surface of the lower substrate protrusion pattern 30. The adhesive 40L may be a liquid ultraviolet (UV) adhesive. The UV adhesive is cured by irradiating UV rays on the lower substrate protrusion pattern 30, and does not require a high temperature condition in the bonding process. However, other adhesives may be used.

In addition, a liquid reagent (R) is injected in the chambers 21 of the lower substrate 12, which are located at the farthest distance from the center portion of the lower substrate 12. The reagent R is mixed with the fluid injected into the microfluidic device 100 to detect a material included in the fluid or to perform a qualitative analysis or a quantitative analysis of the fluid. The same kind of reagent R may be injected into all of the chambers 21, or different kinds of reagents R may be injected in the chambers 21.

According to an exemplary embodiment of the present invention, the adhesive 40L may be applied using an inkjet method. In the inkjet method, the adhesive 40L is ejected onto the upper surface of the lower substrate protrusion pattern 30 using an inkjet printer (not shown) having at least one nozzle. The adhesive amount ejected once through the nozzle of the inkjet printer may range between 1 pl (picoliter) and 100 µl (microliter). Thus, the adhesive 40L may be applied in an appropriate amount on the upper surface of the lower substrate protrusion pattern 30. In addition, even when the lower substrate protrusion pattern 30 is changed, the adhesive 40L may be applied using conventional equipment without equipment change. Also, the present invention is not limited to the use of the inkjet method.

According to another exemplary embodiment of the present invention as shown in FIG. 5, instead of applying the adhesive 40L on the upper surface of the lower substrate protrusion pattern 30, the adhesive 40L may be applied onto a surface of the upper substrate 14 facing the lower substrate 12, that is, a bottom surface of the upper substrate 14 corresponding to the lower substrate protrusion pattern 30. In more detail, the upper substrate 14 is turned over so that the bottom surface of the upper substrate 14 faces upward and the adhesive 40L is applied on the bottom surface of the upper substrate 14 via the inkjet method. In an experiment performed by the inventors, when the adhesive 40L was applied onto the upper substrate 14 in an ejection amount of 600 dpi (dot per inch) and 50 to 75 pl per dot and then the upper substrate 14 and the lower substrate 12 were bonded to each other, there was no leakage of the fluid from the microfluidic structure 20.

Figure 3:
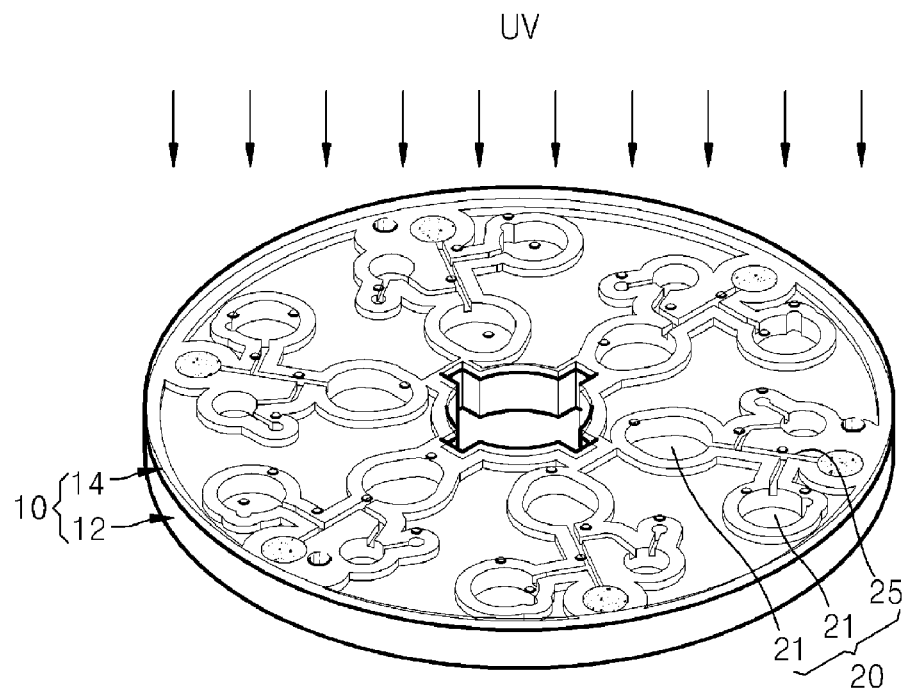
Figure 4:
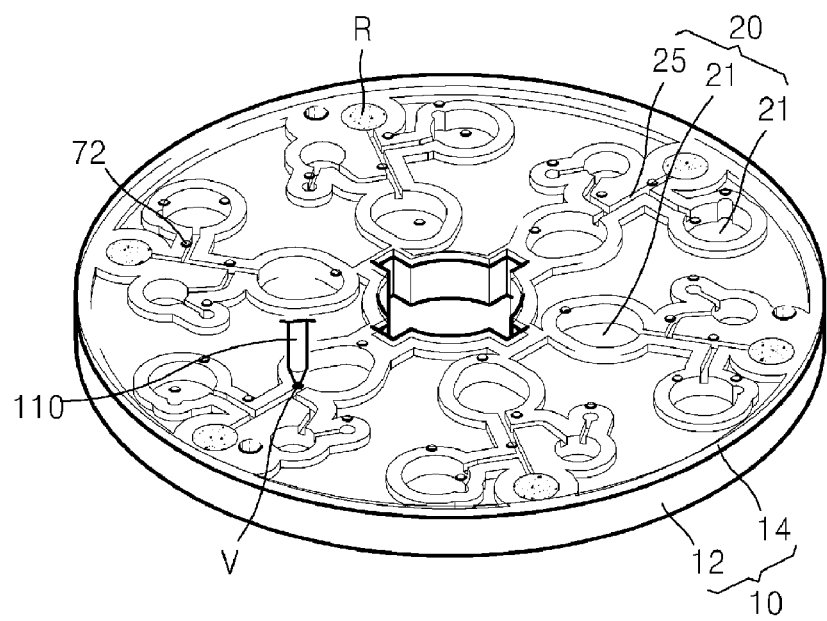

Next, the upper substrate 14 and the lower substrate 12 are attached to each other, and thus the adhesive 40L is disposed between the lower substrate protrusion pattern 30 and the upper substrate 14. In addition, as shown in FIG. 3, the adhesive 40L is cured by UV rays to bond the lower substrate 12 and the upper substrate 14 to each other. The adhesive 40L does not generate high temperature heat during the curing process, and thus, the reagent R received in the chamber 21 does not vaporize or degenerate. However, the present invention is not limited to the example of curing the adhesive 40L using UV rays. The upper substrate 14 and the lower substrate 12 may be bonded to each other by heat, pressure, or electromagnetic waves according to the kind of the adhesive 40L.

Referring to FIG. 8A, only the lower substrate protrusion pattern 30 is bonded to the upper substrate 14 using the cured adhesive layer 40H, and the lower substrate 12 and the upper substrate 14 are separated from each other in other regions. Therefore, even when the adhesive layer 40H generates gas in the attaching and curing processes of the upper and lower substrates 14 and 12, the gas may be easily discharged to peripheral regions of the lower substrate protrusion pattern 30, and thus, the generation of air bubbles in the adhesive layer 40H may be prevented. Then, bonding reliability may be improved, and thus, the upper and lower substrates 14 and 12 may be bonded to each other reliably even when flatness of the upper substrate 14 or the lower substrate 12 is not perfect.

In another exemplary embodiment of the present invention, the upper substrate protrusion pattern 50 corresponding to the lower substrate protrusion pattern 30 is formed on the upper substrate 14 (refer to FIG. 6), the lower substrate protrusion pattern 30 and the upper substrate protrusion pattern 50 are bonded to each other using the cured adhesive layer 40H as shown in FIG. 8B, and the lower substrate 12 and the upper substrate 14 are separated from each other in other portions.

The method of fabricating the microfluidic device 100 may further include a process of forming at least a valve 70 (refer to FIGS. 4 and 7) for controlling the flow of the fluid through the channel 25. In more detail, in order to form the valve 70, the fabrication method may further include processes of injecting a valve material (V) in a melted state through the valve material injection hole valve material injection holes 72 using a dispenser 110, and curing the valve material V in the platform 10.

Figure 9:
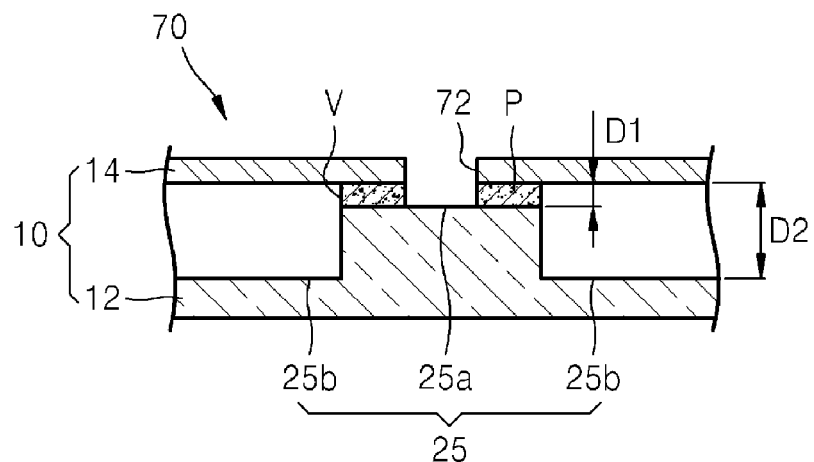
FIG. 9 is a cross-sectional view of a valve included in the microfluidic device of FIG. 7 taken along line B-B', according to an exemplary embodiment of the present invention.
Figure 10:
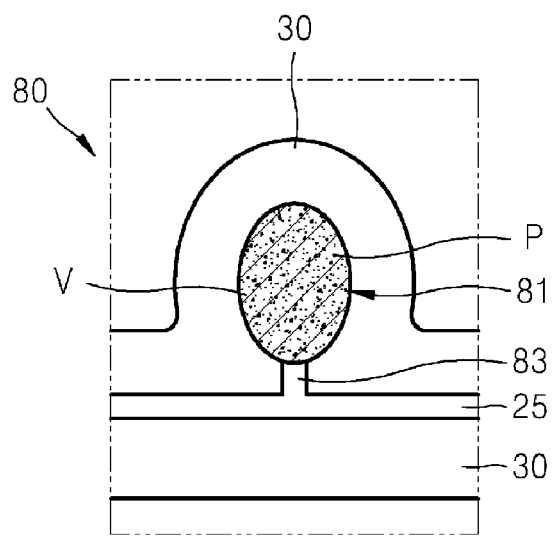
FIG. 10 is a plan view of another example of a valve included in the microfluidic device according to an exemplary embodiment of the present invention.

FIG. 9 is a cross-sectional view of the valve 70 in the microfluidic device 100, taken along B-B' line in FIG. 7, and FIG. 10 is a plan view of a valve 80, which may be formed in the microfluidic device 100 instead of the valve 70.

Referring to FIG. 9, the valve 70 is a normally closed valve for opening the channel 25 that is closed in an initial stage. The valve 70 is formed of the valve material V that is in a solid state at a room temperature and melts when absorbing electromagnetic waves. The valve material V includes a phase transition material, which is in a solid state at a room temperature and melts at a high temperature, and a plurality of fine heat generating particles P, which are dispersed in the phase transition material and easily generate heat according to the energy of electromagnetic waves so as to melt the phase transition material.

The valve material V may be formed by dispersing heat generating particles in a dispersion medium formed of a phase transition material that is in a solid state at a room temperature. The channel 25 includes a first region 25a having a first dimension D1 and a second region 25b adjacent to the first region 25a. The second region 25b has a second dimension D2 that is greater than the first dimension D1.

The valve material V is loaded in a melted state through the valve material injection hole 72 and reaches the first region 25a by a capillary force to block a part of the first region 25a, which does not overlap with the valve material injection hole 72, and then, is solidified at a room temperature to block the flow of the fluid. When electromagnetic waves, generated for example by a laser, are irradiated onto the valve material V that closes the channel 25, the fine heat generating particles P included in the valve material V rapidly generate heat so that the phase transition material melts due to the temperature increase. Accordingly, the valve material V moves from the first region 25a to the second region 25b, and then, is solidified again while opening the channel 25.

The phase transition material included in the valve material V may be wax. Wax melts into liquid when heated, and the volume of wax expands. The wax may be paraffin wax, microcrystalline wax, synthetic wax, or natural wax.

On the other hand, the phase transition material may be a gel or a thermosetting resin. The gel may be a polyacrylamide, a polyacrylates, a polymethacrylates, or a polyvinylamides. In addition, the thermosetting resin may be cyclic olefin copolymer (COC), polymethylmethacrylate (PMMA), polycarbonate (PC), polystyrene (PS), polyoxymethylene (POM), perfluoralkoxy (PFA), polyvinylchloride (PVC), polypropylene (PP), polyethylene terephthalate (PET), polyetheretherketone (PEEK), polyamide (PA), polysulfone (PSU), or polyvinylidene fluoride (PVDF).

Each of the fine heat generating particles P has a diameter of 1 nm to 100 μm so as to freely pass through the channel 25. When the electromagnetic waves are supplied by laser irradiation to the fine heat generating particles P, the temperature of the fine heat generating particle P rapidly rises so that they generate heat and are dispersed evenly in the wax. Therefore, each of the fine heat generating particles P may have a structure including a core having a metal component, and a hydrophobic surface. For example, the fine heat generating particle P may have a molecular structure including a core formed of Fe and a plurality of surfactants that are combined with Fe to surround the Fe component.

In general, the fine heat generating particles P are stored in a dispersed state in a carrier oil. The carrier oil may also have a hydrophobic property so that the fine heat generating particles P having the hydrophobic surface structure may be evenly dispersed in wax. The valve material V may be fabricated by mixing the melted phase transition material with the carrier oil, in which the fine heat generating particles P are dispersed.

The fine heat generating particle P is not limited to the above polymer particle, and may be of a quantum dot type or a magnetic bead type. In addition, the fine heat generating particle P may be a metal oxide particle such as $Al_2O_3$, $TiO_2$, $Ta_2O_3$, $Fe_2O_3$, $Fe_3O_4$, or $HfO_2$.

Referring to FIG. 10, the microfluidic device 100 may include a valve 80 instead of the valve 70 according to another exemplary embodiment of the present invention. The valve 80 is a normally open valve for closing the channel 25 that is in open in an initial stage. The valve 80 includes a valve chamber 81 connected to the channel 25, and a valve material V, which is filled in the valve chamber 81 in a solid state at a room temperature, and melts and expands when heated by electromagnetic waves, and then coagulates again to close the channel 25.

The phase transition material and the heat generating particles P included in the valve material V are the same as those described with reference to FIG. 9. That is, when electromagnetic waves are irradiated onto the valve material V that coagulated in the valve chamber 81, the heat generating particles P absorb the energy of the electromagnetic waves and heat the phase transition material. Thus, the valve material V melts and the volume of the valve material V expands, and the melted valve material V is induced into the channel 25 through a valve connection path 83 and coagulates in the channel 25 to close the channel 25.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A microfluidic device comprising:
a platform comprising an upper substrate and a lower substrate that are bonded to face each other;
a microfluidic structure obtained by forming grooves in the lower substrate;
a lower substrate protrusion pattern comprising an outline protrusion that protrudes from the lower substrate toward the upper substrate along an outline of the microfluidic structure; and
an adhesive layer disposed between the lower substrate protrusion pattern and the upper substrate in order to bond the upper substrate and the lower substrate to each other,
wherein the lower substrate protrusion pattern contacts the upper substrate, and portions of the lower substrate except for the lower substrate protrusion pattern do not contact the upper substrate.

2. The microfluidic device of claim 1, wherein the lower substrate protrusion pattern further comprises a boundary protrusion that protrudes from the lower substrate toward the upper substrate along a boundary of the platform.

3. The microfluidic device of claim 1, further comprising:
an upper substrate protrusion pattern that protrudes from the upper substrate toward the lower substrate so as to correspond to the lower substrate protrusion pattern,
wherein the adhesive layer is disposed between the lower substrate protrusion pattern and the upper substrate protrusion pattern.

4. The microfluidic device of claim 1, wherein the platform has a disk shape and is configured to rotate at a high speed around the center thereof.

5. The microfluidic device of claim 1, wherein the microfluidic structure comprises one or more chambers that is configured to receive a fluid, and one or more channels connecting the chambers.

6. The microfluidic device of claim 5, further comprising:
at least one kind of liquid reagent that is received in at least one of the one or more chambers.

7. The microfluidic device of claim 6, wherein the adhesive layer comprises an ultraviolet (UV) adhesive that is cured by a UV ray.

8. The microfluidic device of claim 5, further comprising:
one or more valves for controlling flow of the fluid through the channels.

9. The microfluidic device of claim 8, wherein the valve comprises a valve material that is in a solid state at a room temperature and melts when heated by electromagnetic waves, wherein the valve material comprises a phase transition material that is in a solid state at the room temperature and a plurality of heat generating particles that generate heat to melt the phase transition material when heated by the electromagnetic waves, and wherein the heat generated particles are dispersed in the phase transition material.

10. The microfluidic device of claim 8, wherein the valve is a normally closed valve for opening the channels, or a normally open valve for closing the channels.

11. A microfluidic device comprising:

an upper substrate and a lower substrate bonded to each other; and a microfluidic structure comprising at least one chamber configured to contain a fluid, and at least one channel connected to the at least one chamber for flow of the fluid, wherein the at least one chamber and the at least one channel are formed by a protrusion pattern formed on at least one of an inner surface of the upper substrate and an inner surface of the lower substrate, wherein the upper and lower substrates are bonded to each other through an adhesive formed on an upper surface of the protrusion pattern facing the inner surface of the upper substrate or the inner surface of the lower substrate.

* * * * *